United States Patent
Kimura

(10) Patent No.: US 7,821,261 B2
(45) Date of Patent: Oct. 26, 2010

(54) DATA PROCESSING SYSTEM, DATA PROCESSING METHOD, DIAGNOSTIC IMAGING APPARATUS, AND MAGNETIC RESONANCE IMAGING APPARATUS

(75) Inventor: Tokunori Kimura, Yaita (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 957 days.

(21) Appl. No.: 11/520,809

(22) Filed: Sep. 14, 2006

(65) Prior Publication Data
US 2007/0120566 A1 May 31, 2007

(30) Foreign Application Priority Data
Nov. 28, 2005 (JP) ............................. 2005-342174

(51) Int. Cl.
*G01V 3/00* (2006.01)
(52) U.S. Cl. ..................................................... 324/307
(58) Field of Classification Search ......... 324/300–322; 600/410–435
See application file for complete search history.

(56) References Cited

U.S. PATENT DOCUMENTS

| | | | | |
|---|---|---|---|---|
| 5,517,122 A | * | 5/1996 | Chen | 324/322 |
| 5,551,431 A | * | 9/1996 | Wells et al. | 600/410 |
| 5,578,923 A | * | 11/1996 | Chen | 324/309 |
| 6,094,050 A | * | 7/2000 | Zaroubi et al. | 324/309 |
| 6,466,016 B1 | * | 10/2002 | Miyoshi | 324/312 |
| 6,549,007 B1 | * | 4/2003 | Hills et al. | 324/306 |
| 6,630,827 B1 | * | 10/2003 | Miyoshi et al. | 324/307 |
| 6,759,847 B2 | * | 7/2004 | Brinker et al. | 324/309 |
| 6,812,698 B1 | * | 11/2004 | Tsukamoto | 324/309 |
| 7,030,615 B2 | * | 4/2006 | Gortler | 324/318 |
| 7,181,085 B1 | * | 2/2007 | Despain | 382/261 |
| 7,187,172 B2 | * | 3/2007 | Bielmeier et al. | 324/314 |
| 7,336,811 B2 | * | 2/2008 | Takeo | 382/132 |
| 7,342,398 B2 | * | 3/2008 | Bielmeier et al. | 324/314 |
| 2007/0120566 A1 | * | 5/2007 | Kimura | 324/322 |
| 2007/0232914 A1 | * | 10/2007 | Chen et al. | 600/443 |

OTHER PUBLICATIONS

Extended European Search Report dated Mar. 12, 2009 in EP 06 01 9087.

Kimura T., "SNR improvement by modification of Wiener filter for the applications of acquiring multiple similar data: Application to diffusion tensor imaging," Proceedings of the International Society for Magnetic Resonance in Medicine, 14th Scientific Meeting and Exhibition, Seattle, Washington, USA, May 6-12, 2006, p. 3209, XP002517417.

(Continued)

*Primary Examiner*—Brij B Shrivastav
*Assistant Examiner*—Dixomara Vargas
(74) *Attorney, Agent, or Firm*—Nixon & Vanderhye PC

(57) ABSTRACT

A data processing system configured to process acquired image data (e.g., as part of a diagnostic imaging apparatus) uses a signal-power estimating unit for estimating signal power by using reference data containing data different from processing-target data and a data processing unit for processing the processing-target data by using a WF (wiener filter) based on the signal power estimated by the signal-power estimating unit.

5 Claims, 19 Drawing Sheets

OTHER PUBLICATIONS

Kadah Y. M., "Adaptive Denoising of Event-Related Functional Magnetic Resonance Imaging Data Using Spectral Subtraction," IEEE Transactions on Biomedical Engineering, IEEE Service Center, Piscataway, NJ, US, vol. 51, No. 11, Nov. 1, 2004, pp. 1944-1953, XP011120471, ISSN: 0018-9294.

Wei Li et al., "A 3D Adaptive Wiener Filter for Restoration of SPECT Images Using MRI as Reference Images," Engineering in Medicine and Biology Society, 2005, IEEE-EMBS 2005, 27th Annual International Conference of the Shanghai, China Sep. 1-4, 2005, Piscataway, NJ, USA, IEEE, Jan. 1, 2005, pp. 3100-3103, XP031001255, ISBN: 978-0-7803-8741-6.

Letcher J.H., "The use of Wiener Deconvolution (An Optimal Filter) in Nuclear Magnetic Resonance Imaging," International Journal of Imaging Systems and Technology, Wiley and Sons, New York, US, vol. 1, No. 1, Jan. 1, 1989, pp. 109-112, XP000161134, ISSN: 0899-9457.

Ayaz H. et al., "Functional Near-Infrared Neuroimaging," IEEE Transactions on Neural Systems and Rehabilitation Engineering, IEEE Service Center, New York, NY, US, vol. 13, No. 2, Jun. 1, 2005, pp. 153-159, XP011133570, ISSN: 1534-4320.

Bunce S. et al., "Motion Artifact Cancellation in NIR Spectroscopy Using Wiener Filtering," IEEE Transactions on Biomedical Engineering, IEEE Service Center, Piscataway, NJ, US, vol. 52, No. 5, May 1, 2005, pp. 934-938, XP011130492, ISSN: 0018-9294.

Ito S. et al., "Image denoising using frebas multi-resolution image analysis," Image Processing, 2004, ICIP '04, 2004 International Conference on Singapore Oct. 24-27, 2004, Piscataway, NJ, USA, IEEE, vol. 2, Oct. 24, 2004, pp. 977-980, XP010785168, ISBN: 978-0-7803-8554-2.

Chinese Office Action dated Jun. 19, 2009, re CN 2006-101723713.

Itou et al., Medical Imaging Technology, vol. 19, No. 5, p. 355-69 (2001).

Jain et al., "The Wiener Filter", Fundamental Digital Image Processing, Presence Hall Information and System Science Series, p. 276-83 (1989).

* cited by examiner

MRI IMAGE PROVIDED WITHOUT
RECOVERY PROCESSING
(RMSE=0.3785, SNR=1/64.9)

IDEAL MRI IMAGE
(RMSE=0, SNR=1/11.8)

MRI IMAGE PROVIDED BY DATA
SUBJECTED TO RECOVERY PROCESSING
USING "FRWF" BASED ON
"same_Ps" SYSTEM
(RMSE=0.2477, SNR=1/40.2)

MRI IMAGE PROVIDED BY DATA
SUBJECTED TO RECOVERY
PROCESSING USING "FRWF"
BASED ON "ideal_Ps"
(RMSE= 0.1345, SNR=1/6.7)

MRI IMAGE PROVIDED BY DATA
SUBJECTED TO RECOVERY PROCESSING
USING "FTWF" BASED ON
"same_Ps" SYSTEM
(RMSE=0.2642, SNR=1/45.1)

MRI IMAGE PROVIDED BY DATA
SUBJECTED TO RECOVERY
PROCESSING USING "FTWF"
BASED ON "ideal_Ps"
(RMSE=0.1693, SNR=1/23.1)

DATA PROCESSING SYSTEM, DATA PROCESSING METHOD, DIAGNOSTIC IMAGING APPARATUS, AND MAGNETIC RESONANCE IMAGING APPARATUS

BACKGROUND

1. Technical Field

The present invention relates to a wiener_filter used for a reduction in a noise of data (i.e., for an improvement in a signal to noise ratio (SNR)) and data processing. In particular, the present invention relates to a data processing system, a data processing method, a diagnostic imaging apparatus, and a magnetic resonance imaging apparatus for optimally processing data depending on the noise of data and deterioration characteristics.

2. Related Art

A magnetic resonance imaging is a technique for magnetically exciting nuclear spins in a patient (subject) located in a static magnetic field by using a high Larmor frequency and reconstructing an image from MR signals, such as echo signals, generated in response to the excitation. For the magnetic resonance imaging, it is very important to improve the SNR and spatial resolution per unit time.

A wiener_filter (WF) that was devised based on likelihood maximization of the amount of information is available. The WF is a filter for optimizing the SNR of data defined in Fourier space (also referred to as "k space" or "frequency space"). In theory, an ideal_WF is defined in Fourier space and a WF aimed for only noise recovery processing (the WF will be particularly referred to as a wiener-smoothing-filter (WSF)) is represented as a following expression (1), where "Ps" indicates signal power (power spectrum) and "Pn" indicates noise power.

$$WF = \frac{Ps}{Ps + Pn} \quad (1)$$

Alternatively, if the SNR is defined as a following expression (2), the WF is represented as a following expression (3) from the expressions (1) and (2).

$$SNR = \frac{Ps}{Pn} \quad (2)$$

$$WF = \frac{1}{1 + \frac{1}{SNR}} \quad (3)$$

The expression (3) is defined based on a variety of assumptions and a particularly important point is that the Ps must be the signal power that does not contain the noise. In addition, a general expression including not only the noise but also recovery processing of deterioration, such as blur, is represented as a following expression (4), where "H" indicates a deterioration characteristic in the filter space and "*" indicates a complex conjugate.

$$WF = \frac{H * Ps}{|H|^2 Ps + Pn} \quad (4)$$

However, in the actual application of the WF, when the H and the Pn are known or measurable, the values are used as the H and the Pn. On the other hand, since an ideal signal power (ideal_Ps) that does not contain the noise cannot be generally known, the ideal_Ps cannot be used as the Ps. Accordingly, actual data is first measured and noise-contaminated signal power ($Ps_d$) is used as the ideal_Ps to determine the WF in an approximated manner.

In addition, although the WF was originally conceived for Fourier space, it is not only applied to frequency space, but is also applied to, for example, fresnel transform band splitting (FREBAS) space, in which the deterioration of high frequency components is considered to be less.

However, compared to a case in which the ideal_Ps is used, the related art is greatly inferior in performance for an improvement in the SNR, i.e., a reduction in the noise while maintaining a spatial frequency. In addition, for data having a smaller SNR, the deterioration of the image quality (filtering effect) is more prominent. Thus, when the WF is actually used, the issue is how to estimate the ideal_Ps based on the $Ps_d$, which is a noise-containing processing-target data.

FIG. 37 shows a gain characteristic relative to an SNR in the ideal_WF. For a portion where the SNR (=Ps/Pn) is large, i.e., where "Ps>>Pn" is sufficiently satisfied, the WF is substantially equal to 1, which does not cause a large influence. On the other hand, for a portion where the Ps approaches the Pn, the WF approaches "0" to reduce the gain, so that the noise is optimally reduced in accordance with the sizes of the Ps and the Pn while high-frequency components are reserved as much as possible.

Therefore, as shown in FIG. 38 (for the $Ps_d$ with only one scan), the Ps is closer to the Pn since the gain decreases for high-frequency components of data. Thus, with the WF, variations in high-frequency components are more likely to affect the characteristics than low-frequency components.

SUMMARY

The present exemplary embodiment has taken into consideration above-described problems, and provides a data processing system, a data processing method, a diagnostic imaging apparatus, and a magnetic resonance imaging apparatus such that in an application to processing-target data having actual noise, an SNR is improved while spatial frequency components of a processing-target data are reserved as much as possible, and an adequate WF having a large improvement effect of characteristic deterioration allows data processing to be appropriately performed.

To solve the above-described problems, the present exemplary embodiment provides the data processing system, comprising: a signal-power estimating unit for estimating signal power by using reference data containing data different from processing-target data; and a data processing unit for processing the processing-target data by using a WF based on the signal power estimated by the signal-power estimating unit.

To solve the above-described problems, the present exemplary embodiment provides the data processing method, comprising steps of: (A) estimating signal power by using reference data containing data similar to processing-target data; and (B) processing the processing-target data by using a WF based on the signal power estimated in the step of (A).

To solve the above-described problems, the present exemplary embodiment provides the diagnostic imaging apparatus, comprising: a signal-power estimating unit for estimating signal power by using reference data containing data different from processing-target data; a data processing unit for processing the processing-target data by using a WF based on the signal unit estimated by the signal-power estimating unit; an image reconstructing unit for reconstructing an image in real space by subjecting the processing-target data, processed by the data processing unit, to two-dimensional or three-dimensional Fourier transform for each set of data; and a synthesis and difference-operation processing unit for performing synthesis processing and/or difference-operation processing on the image reconstructed by the image reconstructing unit.

To solve the above-described problems, the present exemplary embodiment provides the magnetic resonance imaging apparatus, comprising: an image capture section for generating magnetic resonance signals by applying gradient magnetic fields and high-frequency pulses to a subject in a static magnetic field; a high-frequency coil for detecting the magnetic resonance signals; an acquiring unit for arranging the magnetic resonance signals, detected by the high-frequency coil, in frequency-band-split space; an image generating unit for generating multiple images by reconstructing data arranged in the frequency-band-split space by the acquiring unit; and a filter for using, as signal power in frequency-band-split space of the processing-target image, signal power of data in frequency-band-split space in which, an image of the multiple images which has a highest similarity to a processing-target image, wherein a gain is increased for a band in which an SNR is higher in the frequency-band-split space and the gain is reduced for a band in which the SNR is lower.

Therefore, according to the present exemplary embodiment to provide the data processing system, the data processing method, the diagnostic imaging apparatus, and the magnetic resonance imaging apparatus, in the application to processing-target data having actual noise, the SNR is improved while spatial frequency components of the processing-target data are reserved as much as possible, and the adequate WF having the large improvement effect of characteristic deterioration allows data processing to be appropriately performed.

DESCRIPTION OF THE PREFERRED EMBODIMENTS

A data processing system, a data processing method, a diagnostic imaging apparatus, and a magnetic resonance imaging apparatus according to the present exemplary embodiment will now be described with reference to the accompanying drawings.

Figure 1:
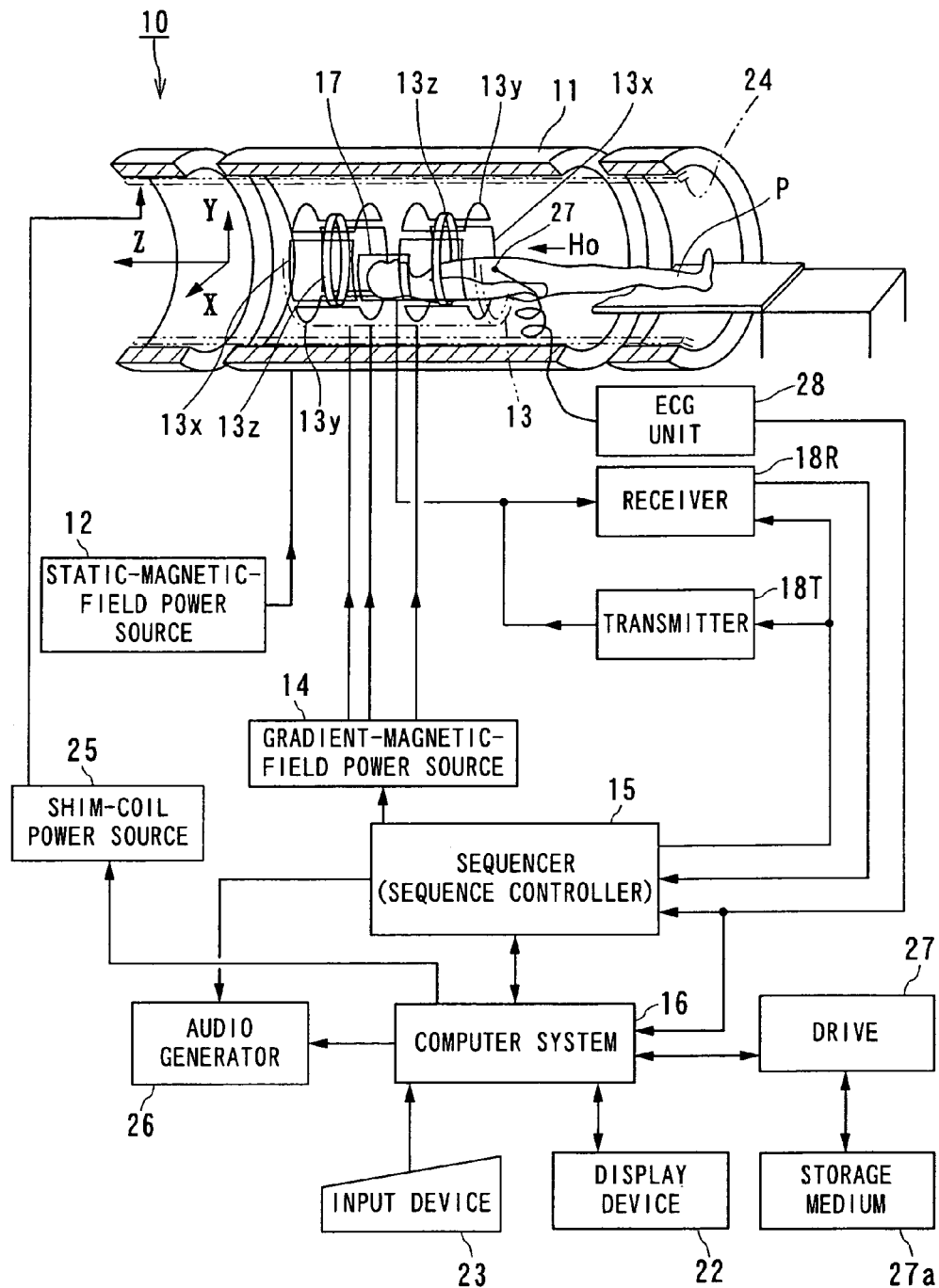
FIG. 1 is a schematic diagram showing a data processing system, a diagnostic imaging apparatus, and a magnetic resonance imaging apparatus according to the present exemplary embodiment.

FIG. 1 is the schematic diagram showing the data processing system, a diagnostic imaging apparatus, and a magnetic resonance imaging apparatus according to the present exemplary embodiment.

FIG. 1 shows a diagnostic imaging apparatus, for example, a magnetic resonance imaging (MRI) apparatus 10, for capturing images of a portion of a patient (subject) to generate medical images. The diagnostic imaging apparatus is not limited to the magnetic resonance imaging apparatus 10 and may be another diagnostic imaging apparatus for generating medical images. Examples include an X-ray computerized tomography (CT) apparatus, a single photon emission computed tomography (SPECT) apparatus, a positron emission tomography (PET) apparatus, a PET-CT apparatus, and an ultrasonic diagnostic apparatus.

The magnetic resonance imaging apparatus 10 includes a bed portion on which a patient P lies, a static-magnetic-field generator for generating a static magnetic field, a gradient-magnetic-field generator for adding position information to the static magnetic field, a transmitting/receiving section for transmitting/receiving high-frequency signals, a controlling and computing section for controlling the entire system and for reconstructing images, and an electrocardiogram measuring section for measuring electrocardiograph (ECG) signals serving as signals indicating the cardiac time phase of the patient P.

The static-magnetic-field generator includes a magnet (e.g., a superconducting magnet) 11 and a static-magnetic-field power source 12 for supplying electrical current to the magnet 11. The magnet 11 and the static-magnetic-field power source 12 generate a static magnetic field $H_0$ in the axis direction (i.e., z-axis direction) of a cylindrical opening (i.e., space for diagnosis) into which the patient P is inserted with clearance. The magnet 11 has shim coil 24. Under the control of a computer system 16 described below, a shim-coil power source 25 supplies electrical current for equalizing the static magnetic field to the shim coil 24. The bed portion can be inserted into the opening in the magnet 11 so that the top plate on which the patient P lies can be retracted.

The gradient-magnetic-field generator has a gradient-magnetic-field coil unit 13 incorporated into the magnet 11. The gradient-magnetic-field coil unit 13 has three sets (types) of coils, namely, an x-coil 13x, a y-coil 13y, and a z-coil 13z, for generating gradient magnetic fields in an X-axis direction, a Y-axis direction, and a Z-axis direction which are perpendicular to each other. The gradient-magnetic-field generator is provided with a gradient-magnetic-field power source 14 for supplying current to the x-coil 13x, the y-coil 13y, and the z-coil 13z. Under the control of a sequencer 15 described below, the gradient-magnetic-field power source 14 supplies pulse currents for generating gradient magnetic fields in the x-coil 13x, the y-coil 13y, and the z-coil 13z.

The gradient-magnetic-field power source 14 controls the pulse current to be supplied to the x-coil 13x, the y-coil 13y, and the z-coil 13z to combine the gradient magnetic fields in three physical axes (i.e., the x-axis, y-axis, and z-axis) directions. This makes it possible to arbitrarily set or change logic-axis directions including a slice-direction gradient magnetic field $G_S$, a phase-encoding direction gradient magnetic field $G_E$, and a read-direction (frequency encoding direction) gradient magnetic field $G_R$, which are perpendicular to each other. The gradient magnetic fields in a slice encoding (SE) direction, in a phase encoding (PE) direction, and in a read out (RO) direction are superimposed on the static magnetic field $H_0$.

The transmitting/receiving section has an RF coil 17, which is provided adjacent to the patient P in the image-capture space in the magnet 11, and a transmitter 18T and a receiver 18R, which are connected to the RF coil 17. The transmitter 18T and the receiver 18R operate under the control of the sequencer 15 described below. Through the operation, the transmitter 18T supplies an RF current pulse having a Larmor frequency for exciting nuclear magnetic resonance (NMR) to the RF coil 17. The receiver 18R receives MR signals (high-frequency signals) received by the RF coil 17; performs various types of signal processing, such as preamplification, intermediate-frequency conversion, phase detection, low-frequency amplification, and filtering; and them performs A/D conversion on the resulting signals to generate digital echo data of the MR signals (the data is also referred to as "original data" or "raw data").

In addition, the controlling and computing section includes the sequencer 15 (also referred to as a "sequence controller"), the computer system 16, a display device 22, an input device 23, and an audio generator 26. The computer system 16 has functions for issuing a pulse-sequence information instruction to the sequencer 15 and managing the entire operation of the magnetic resonance imaging apparatus 10. The controlling and computing section may have a drive 27 to which a storage medium 27a is attachable/detachable.

The sequencer 15 includes a CPU and a memory, which are not shown. The sequencer 15 is configured to store the pulse sequence information sent from the computer system 16, to control the operations of the gradient-magnetic-field power source 14, the transmitter 18T, and the receiver 18R in accordance with the stored information, to temporarily receive the MR-signal echo data output from the receiver 18R, and to transfer the echo data to the computer system 16. The pulse sequence information used herein refers to all information required for causing the gradient-magnetic-field power source 14, the transmitter 18T, and the receiver 18R to operate in accordance with a series of pulse sequences. Examples of the pulse sequence information include the intensity of pulse current applied to the x-coil 13x, the y-coil 13y, and the z-coil 13z; the application period of time; and the application timing.

Figure 2:
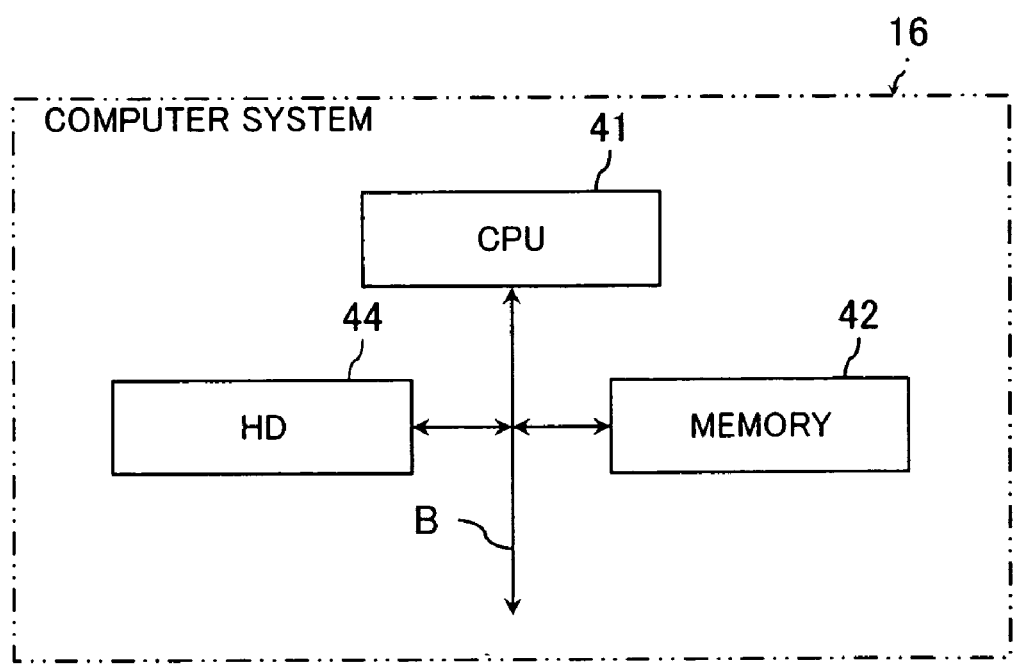
FIG. 2 is a block diagram showing a hardware configuration of a computer system.

FIG. 2 is a block diagram showing the hardware configuration of the computer system 16.

As shown in FIG. 2, the computer system 16 is implemented with hardware including a central processing unit (CPU) 41, a memory 42, a hard disk (HD) 44, and so on. The CPU 41 is interconnected with each hardware element, included in the computer system 16, through a bus B that serves as a common signal-transmission path.

The CPU 41 serves as a controller for controlling the entire computer system 16. The CPU 41 loads, to the memory 42, a program stored on the HD 44 or a program read from the storage medium 27a, which is attached to the drive 27, and installed on the HD 44, and then executes the program.

The memory 42 also has elements such as a read only memory (ROM) and a random access memory (RAM), and serves as a storage medium that is used to store initial program loading (IPL), basic input/output system (BIOS), and data, that is used to temporarily store data, and that is also used as a work memory for the CPU 41.

The HD 44 is implemented with a nonvolatile semiconductor memory or the like. The HD 44 serves as a storage medium for storing programs (including an OS and so on, as well as application programs) installed on the computer system 16, MR-signal echo data transferred from the sequencer 15, and data of reconstructed images and so on.

Figure 3:
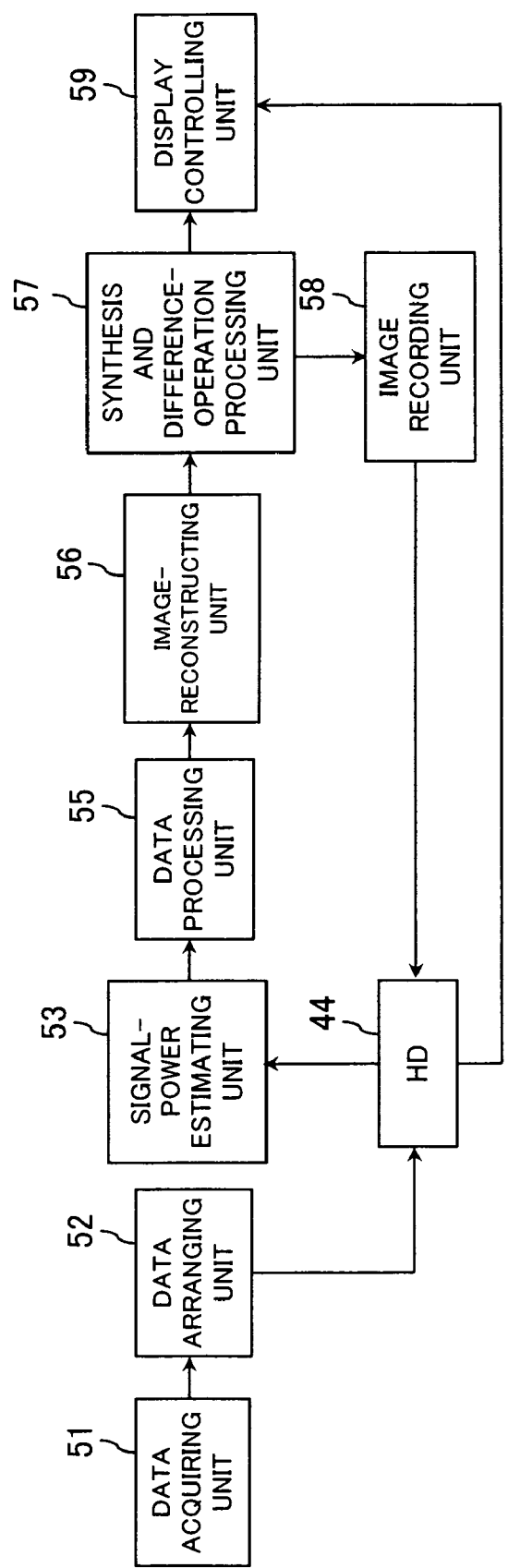
FIG. 3 is a functional block diagram showing functions of a computer system for executing a program stored on a storage device.

FIG. 3 is a functional block diagram showing the functions of the computer system 16 for executing a program stored on the storage device, such as the HD 44.

When the CPU 41 (shown in FIG. 2) reads and executes a program, the computer system 16 serves as a data acquiring unit 51, a data arranging unit 52, a signal-power estimating unit 53, a data processing unit 55, an image-reconstructing unit 56, a synthesis and difference-operation processing unit 57, an image recording unit 58, and a display controlling unit 59. That is, the computer system 16 serves as a data processing system.

The data acquiring unit 51 has a function for acquiring the echo data transferred from the sequencer 15 upon the execution of scanning.

The data arranging unit 52 has a function for arranging the echo data, acquired by the data acquiring unit 51, in Fourier space (also referred to as "k space" or "frequency space") in the HD 44 (shown in FIG. 2).

The signal-power estimating unit 53 has a function for estimating signal power (power spectrum, Ps) by using data that is different from processing-target data arranged in the Fourier space.

The data processing unit 55 has a function for processing the processing-target data, arranged in the Fourier space, by using a WF based on the Ps estimated by the signal-power estimating unit 53.

The image-reconstructing unit 56 has a function for reconstructing, for each set of the processing-target data processed by the data processing unit 55, an image in real space by subjecting the processing-target data to two-dimensional or three-dimensional Fourier transform.

The synthesis and difference-computation processing unit 57 has a function for performing synthesis processing and/or difference-operation processing on the image reconstructed by the image-reconstructing unit 56. The synthesis processing involves addition processing for each pixel, maximum intensity projection (MIP) processing, and so on. As another example of the synthesizing processing, the axes of multiple frames may be aligned in Fourier space to synthesis one-frame raw data by directly using raw data. Examples of the addition processing includes simple addition processing, addition average processing, and weighted addition processing.

The image recording unit 58 has a function for recording, on the HD 44 (shown in FIG. 2), not only reconstructed images but also images subjected to the aforementioned synthesis processing and the difference-operation processing.

The display controlling unit 59 has a function for supplying the image, subjected to the image processing performed by the synthesis and difference-operation processing unit 57, to the display device 22 and causing the display device 22 to display device the image as an MRI image.

The display device 22 shown in FIG. 1 is used to display, for example, a reconstructed image. Information desired-by an operator, such-as parameter information, scan conditions, a pulse sequence, and information regarding the image synthesis and difference operation, can be input to the computer system 16 via the input device 23.

Upon receiving an instruction from the computer system 16, the audio generator 26 can output voice messages for starting breath holding and ending breath holding.

The portable storage medium 27a, such as a flexible disk (FD), a compact disc read only Memory (CD-ROM), a magneto optical (MO) disk, a digital versatile disc (DVD), a magnetic disc, and a semiconductor memory, can be attached to/detached from the drive 27. The drive 27 reads data (including a program) recorded on the storage medium 27a and outputs the read data to the computer system 16, or writes data, supplied from the computer system 16, to the storage medium 27a. The program executed by the CPU 41 can be temporarily or permanently stored (recorded) on the storage medium 27a. Such a storage medium 27a can be supplied as the so-called "package software".

The electrocardiogram measuring section includes an ECG (electrocardiogram) sensor 27 and an ECG unit 28. The ECG sensor 27 is attached to the body surface of the patient P to detect ECG signals as electrical signals. The ECG unit 28 performs various types of processing, including digitization processing, on the sensor signals and outputs the resulting signals to the computer system 16 and the sequencer 15. This arrangement allows for data acquisition based on electrocardiographic synchronization. The ECG sensor 27 and the ECG unit 28 serve as means for detecting information indicating a cardiac time phase.

Figure 4:
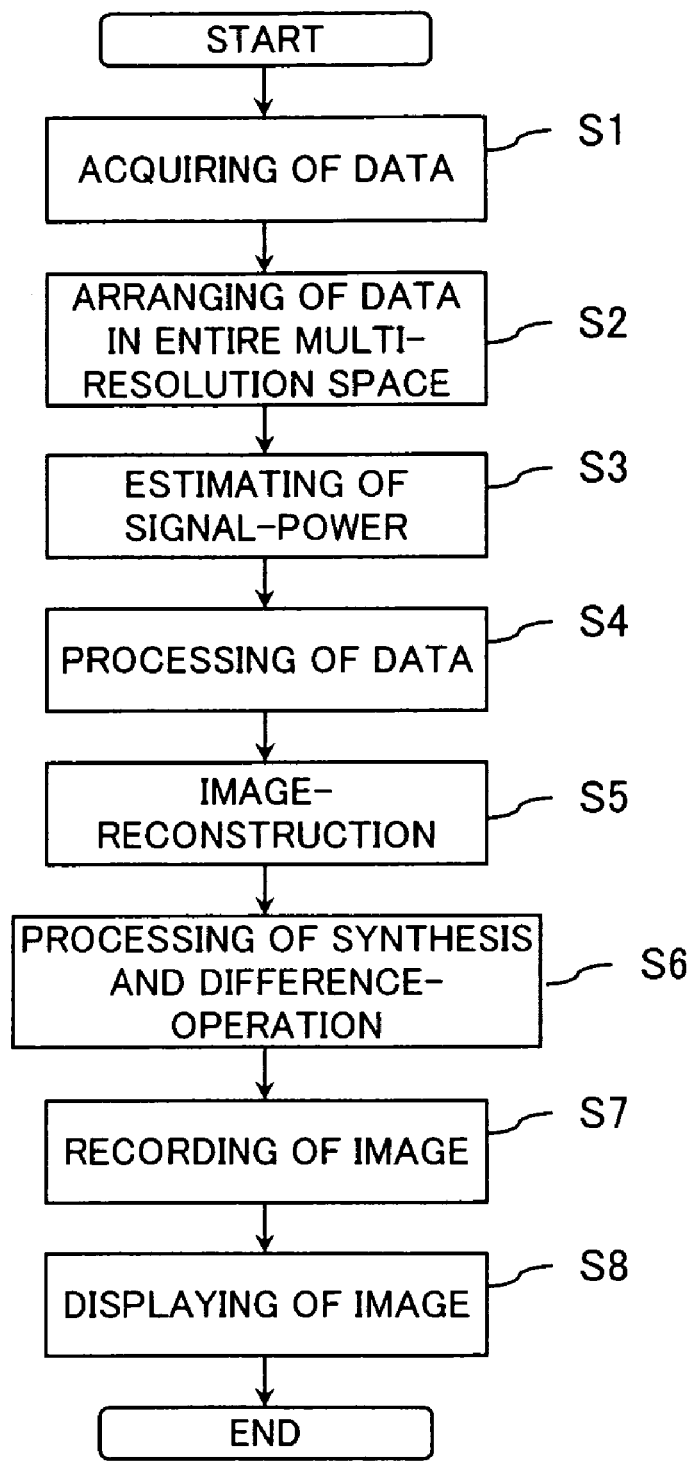
FIG. 4 is a flowchart for a data processing method according to the present exemplary embodiment.

A data processing method according to the present invention will now be described with reference to the flow chart shown in FIG. 4.

When the patient P lies on the bed portion, the static-magnetic-field power source 12 supplies current to the magnet 11 to form a static magnetic field in the magnet 11. Also, the shim-coil power source 25 supplies current to the shim coil 24 to equalize the static magnetic field formed in the image-capture area.

The input device 23 gives an operation instruction, together with sequence-selection information, to the computer system 16. Thus, the computer system 16 supplies a pulse sequence to the sequencer 15. In accordance with the pulse sequence received from the computer system 16, the sequencer 15 drives the gradient-magnetic-field power source 14, the transmitter 18T, and the receiver 18R to form an X-axis gradient magnetic field, a Y-axis gradient magnetic field, and a Z-axis gradient magnetic field in the image-capture area and to generate RF signals.

In this case, the X-axis gradient magnetic field, the Y-axis gradient magnetic field, and the Z-axis gradient field formed in the gradient magnetic-field coil are mainly used as a gradient magnetic field for the phase encoding, a gradient magnetic field for the read out, and a gradient magnetic field for the slice encoding, respectively. Thus, the direction of the spins of atomic nuclei exhibits regularity and the X coordinate and Y coordinate, which are two-dimensional position information, at a slice formed in the Z-axis direction by the gradient magnetic field for the slice encoding are converted by the gradient magnetic field for the phase encoding and the gradient magnetic field for the read out into the amount of phase change in the spins-of atomic nuclei inside the patient P and the amount of frequency change, respectively.

In accordance with the pulse sequence transmitted from the transmitter 18T, RF signals are applied to the RF coil 17. The RF signals are then transmitted from the RF coil 17 to the patient P. In addition, in accordance with the frequency of the RF signals, nuclear magnetic resonance of atomic nuclei contained in a slice occurs to cause NMR signals to be generated. The NMR signals are then received by the RF coil 17 and are sent to the receiver 18R.

Upon receiving the NMR signals from the RF coil 17, the receiver 18R executes various types of signal processing, such as preamplification, intermediate-frequency conversion, phase detection, low-frequency amplification, and filtering. The receiver 18R further performs A/D conversion on the NMR signals to generate echo data, which is digital data of the NMR signals. The echo data generated by the receiver 18R is transferred to the computer system 16.

The data acquiring unit 51 of the computer system 16 acquires the echo data transferred from the sequencer 15 upon the execution of scanning (step S1).

Subsequently, the data arranging unit 52 arranges the echo data, acquired by the data acquiring unit 51, in an entire multi-resolution space, such as Fourier space or fresnel transform band splitting (FREBAS) space, in the storage medium 27a or the storage device, such as the HD 44 shown in FIG. 2 (step S2). The following description is given of an example in which the echo data are arranged in entire Fourier space in the HD 44, unless otherwise particularly stated.

The signal-power estimating unit 53 estimates the signal power by using reference data containing data that is different from the echo data (i.e., processing-target data) arranged in the Fourier space (step S3).

By using a WF based on the signal power estimated by the signal-power estimating unit 53, the data processing unit 55 processes the processing-target data arranged in the Fourier space (step S4).

The image-reconstructing unit 56 subjects the processing-target data, processed by the data processing unit 55, to two-dimensional or three-dimensional Fourier transform for each set of data to reconstruct an image in the real space (step S5).

The synthesis and difference-operation processing unit 57 performs synthesis processing and/or difference-operation processing on the image reconstructed by the image-reconstructing unit 56 (step S6). The synthesis processing involves addition processing for each pixel, maximum intensity projection processing, and so on. As another example of the synthesizing processing, the axes of multiple frames may be aligned in Fourier space to synthesis one-frame raw data by directly using raw data. Examples of the addition processing include simple addition processing, addition average processing, and weighted addition processing.

The image recording unit 58 records, on the storage medium 27*a* or the storage device such as the HD 44, not only reconstructed images but also images subjected to the aforementioned synthesis processing and/or difference-operation processing (step S7).

The display controlling unit 59 supplies the image, subjected to the image processing performed by the synthesis and difference-operation processing unit 57, to the display device 22, and the display device 22 display devices the supplied image as an MRI image (step S8).

The data processing method of the present invention has a feature in the signal power estimating method in step S3. The signal power estimating method will now be described.

First of all, a typical WF was devised based on the principle of likelihood maximization of the amount of information, and it serves as a filter for optimizing the SNR of data defined in frequency space. In theory, a WF is defined in Fourier space and a WF intended for only noise recovery processing (the WF will be particularly referred to as a wiener-smoothing-filter (WSF)) is represented as a following expression (5), where "Ps" indicates the signal power and "Pn" indicates noise power.

$$WF = \frac{Ps}{Ps + Pn} \quad (5)$$

Alternatively, if the SNR is defined as a following expression (6), the WF is represented as a following expression (7) from the expressions (5) and (6).

$$SNR = \frac{Ps}{Pn} \quad (6)$$

$$WF = \frac{1}{1 + \frac{1}{SNR}} \quad (7)$$

The expression (7) is defined based on a variety of assumptions and a particularly important point is that the Ps must be the signal power that does not contain the noise. In addition, a general expression including not only the noise but also recovery processing of deterioration, such as blur, is represented as a following expression (8), where "H" indicates a deterioration characteristic in the filter space and "*" indicates a complex conjugate.

$$WF = \frac{H * Ps}{|H|^2 Ps + Pn} \quad (8)$$

However, in the actual application of the WF, when the H and the Pn are known or measurable, the values are used as the H and the Pn. On the other hand, since an ideal signal power (ideal_Ps) that does not contain the noise cannot be generally known, the ideal_Ps cannot be used as the Ps. Accordingly, actual data is first measured and noise-contaminated signal power (Ps$_d$) is used as the ideal_Ps to determine the WF in an approximated manner.

In this case, in order to distinguish from the ideal form, the signal power, the noise power, and the SNR measured from actual data are indicated by Ps$_d$, Pn$_d$, and SNR$_d$, respectively. The following description is given on the assumption that H is not corrected and the WSF intended for an improvement in the SNR is used as the WF; however, the present exemplary embodiment is also applicable to a case in which H is corrected.

For data in one two-dimensional Fourier space, actually measured signal power Ps$_d$ is expressed by a spatial-frequency function Ps$_d$ (k$_x$, k$_y$). Also, since the actually measured signal power Pn$_d$ can be regarded as being constant in Fourier space, measurement is performed by averaging multiple coordinates of high frequency components in which the noise components with which Ps$_d$ can be ignored are dominant.

Now, some modified examples, using actual data, for determining the WF will be described. When a parameter for controlling the estimated ratio of noise power is indicated by "a", and Ps is expressed by max [0, Ps$_d$ −a×Pn], the following two expressions (8) or (9) are given. For "a=1" and "Ps$_d$>Pn$_d$" in the expression (9), it becomes equal to the theoretical expression.

$$WF = \frac{\max[0, (Ps_d - aPn_d)]}{Ps_d} \quad (9)$$

$$= \max\left[0, \left\{1 - a\left(\frac{1}{SNR_d}\right)\right\}\right] \quad (10)$$

When a parameter "b" for controlling a WF characteristic relative to the SNR is used, the following is represented as expression (11). For further generalization, the expression (11) is applied to the expression (10) and the WF is represented as expression (12). The expressions (9) and (10) correspond to performing threshold processing for bringing, of the Ps$_d$ of measured actual data, noise components and components smaller than noise to zero, and the parameters "a" and "b" are coefficients provided for performing adjustment for a case in which an actual coefficient for controlling the noise and a least squares condition do not necessarily match each other.

$$WF = \frac{1}{\left[1 + a\left(\frac{1}{SNR_d}\right)^b\right]} \quad (11)$$

$$WF = \max\left[0, \left\{1 - a\left(\frac{1}{SNR_d}\right)^b\right\}\right] \quad (12)$$

Figure 5:
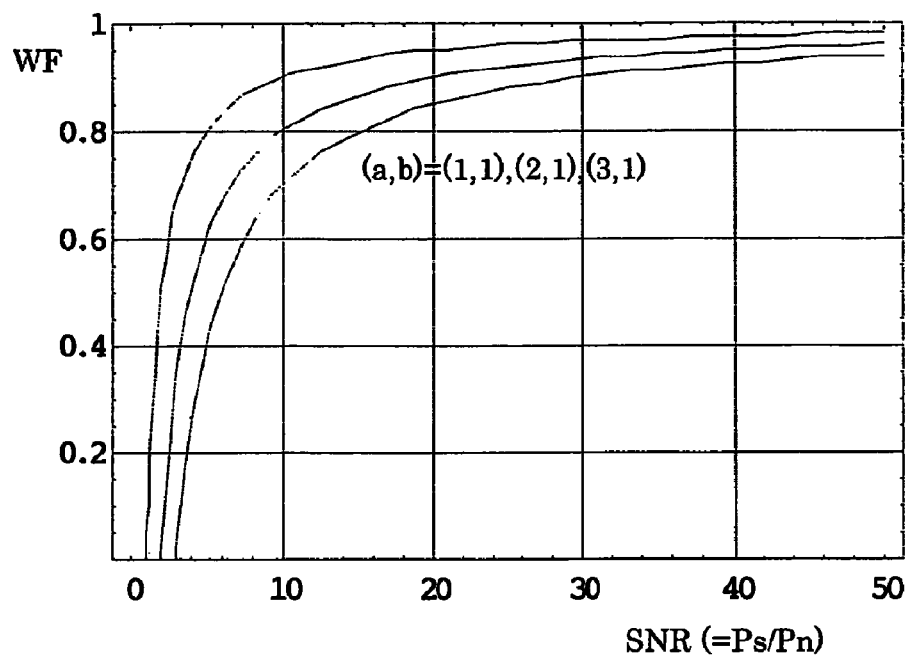
FIG. 5 is a graph showing gain characteristics relative to an SNR, where "a" and "b" are parameters in the WF.
Figure 6:
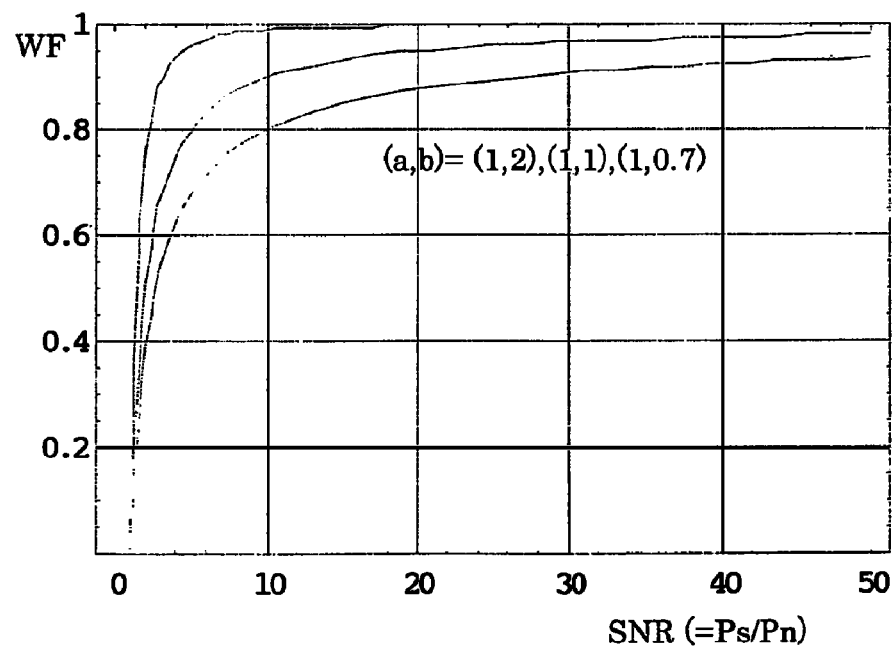
FIG. 6 is a graph showing gain characteristics relative to an SNR, where "a" and "b" are parameters in the WF.

FIGS. 5 and 6 are graphs showing gain characteristics relative to the SNR, where "a" and "b" are parameters in the WF of expression (12). FIG. 5 is graph showing a gain characteristic relative to the SNR, where "(a, b)=(1, 1), (1, 2), and (1, 3)" in the WF of expression (12). FIG. 6 is a graph showing a gain characteristic relative to the SNR, where "(a, b)=(1, 1), (1, 2), and (1, 3)" in the WF of expression (12).

Figure 7:
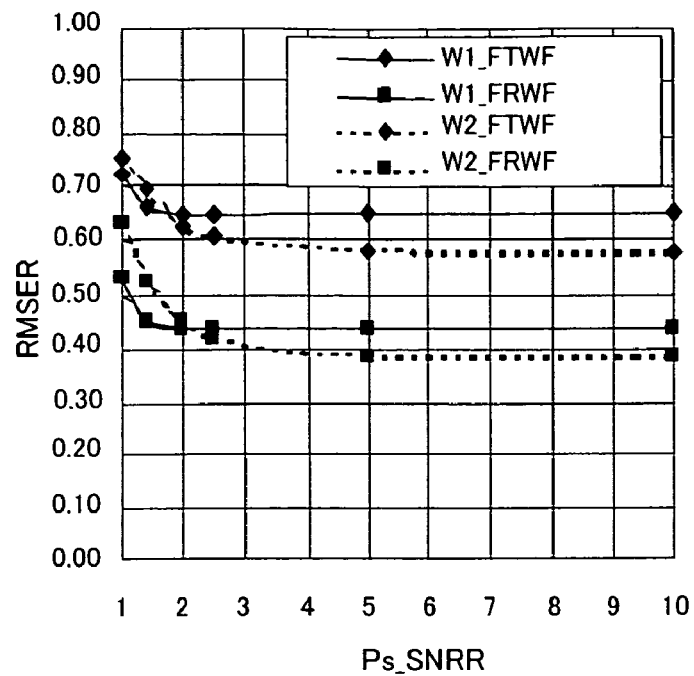
FIG. 7 is a graph showing an improvement factor in an original data.
Figure 8:
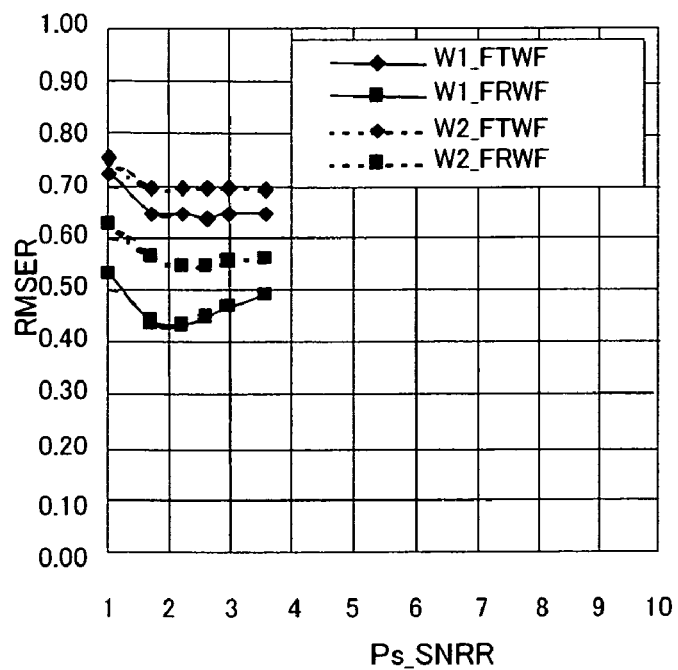
FIG. 8 is a graph showing an improvement factor in an original data.

FIGS. 7 and 8 are graphs showing improvement factors in the original data.

FIG. 7 is a graph showing an improvement factor in the original data in the case of a different_Ps system in which reference data containing data different from processing-target data is used to estimate the Ps. Specifically, FIG. 7 is a graph showing an improvement factor in the original data in the case of a mean_Ps system in which only data similar to processing-target data is used as reference data and the $Ps_d$ obtained by averaging (smoothing) adjacent data points is estimated as the Ps. On the other hand, FIG. 8 is a graph showing an improvement factor in the original data in the case of a same_Ps system in which the $Ps_d$ obtained by averaging adjacent data points is estimated as the Ps based on processing-target data.

More specifically, FIG. 7 shows a Ps_SNRR ("SNR of ideal_Ps/SNR of Psd") versus RMSER (each root mean square error (RMSE) after filtering processing/RMSE before filtering processing) based on RMSE, which is an index for error relative to the ideal data, in the case of the mean_Ps system. In this case, the Ps_SNRRs are 1.0, 1.4, 2.0, 2.5, 5.0 and 10.0. FIG. 8 shows the Ps_SNRR versus RMSER in the case of the same_Ps system, where the $Ps\_{SNRRs\ are}$ 1.0, 1.7, 2.2, 2.6, 3.0, and 3.6.

With respect to each of the mean_Ps system and the same_Ps system, the values were plotted for a case in which filter processing is performed with a WF (FTWF) in typical FT space and a case in which filter processing is performed with a WF (FRWF) in FREBAS space. With respect to the FTWF and the FRWF, the plotting was performed separately for a type W1 for threshold processing and a type W2 that is an ideal type. It can be understood from the figures that an improvement in the SNR of data used as the Ps is effective for improving the SNR of the processing-target data.

It is clear from FIGS. 7 and 8 that the RMSER in the case of the mean_Ps system is smaller than that in the case of the same_Ps system and is thus a superior improvement in the SNR. It is also clear that the FRWF has a smaller RMSER in the filter application space than the FTWF and is thus a superior improvement in the SNR. For both the FTWF and the FRWF, as a basic filter, the type W1 is preferable for "Ps_SNRR<2" and the type W2 is preferable for "Ps_SNRR>2".

In addition, for the optimum value of the Ps_SNRR, which is a ratio of an improvement factor in the SNR to data used for the Ps in the present invention, about 2 (or 4 in the number of acquisition (NAQ)) is enough for the type W1 and about 5 (or 25 in NAQ) is enough for the type W2. Thus, an effect obtained by further increasing the value is small. The present invention requires, in addition to processing-target data, other data (i.e., reference data) having a similar distribution in the filter application space and having a relatively large SNR. However, for example, for application to a case in which the same portion is repeatedly scanned, such as dynamic scanning, there is no need to additionally acquire data similar to processing-target data in order to estimate the Ps. Thus, this method is very effective method depending on an actual application.

Figure 9:
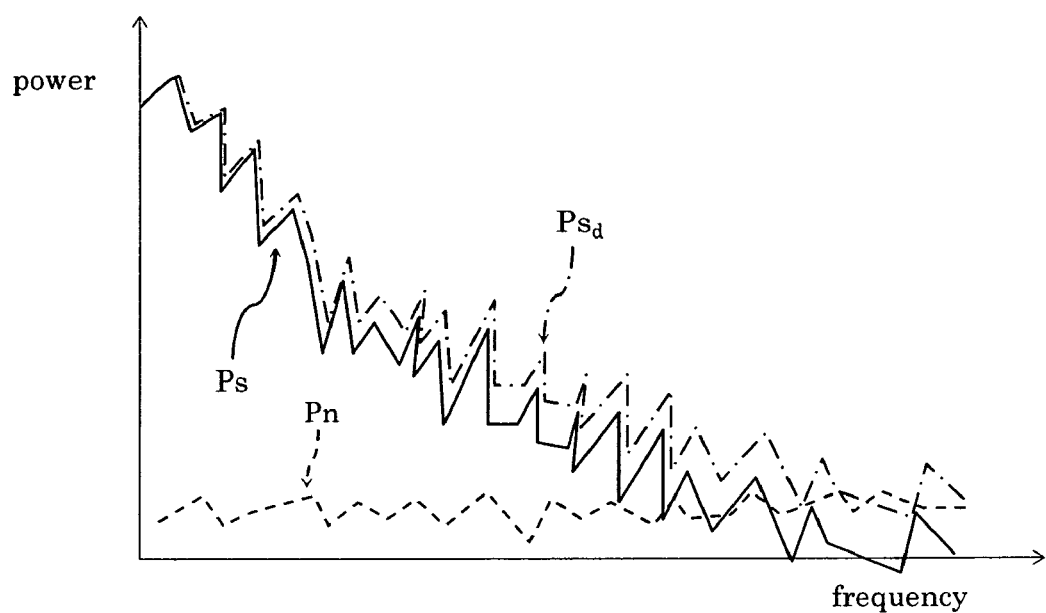
FIG. 9 is a graph showing a relationship between ideal signal power (Ps) and actually measured signal power ($Ps_d$) based on a mean_Ps system.
Figure 38:
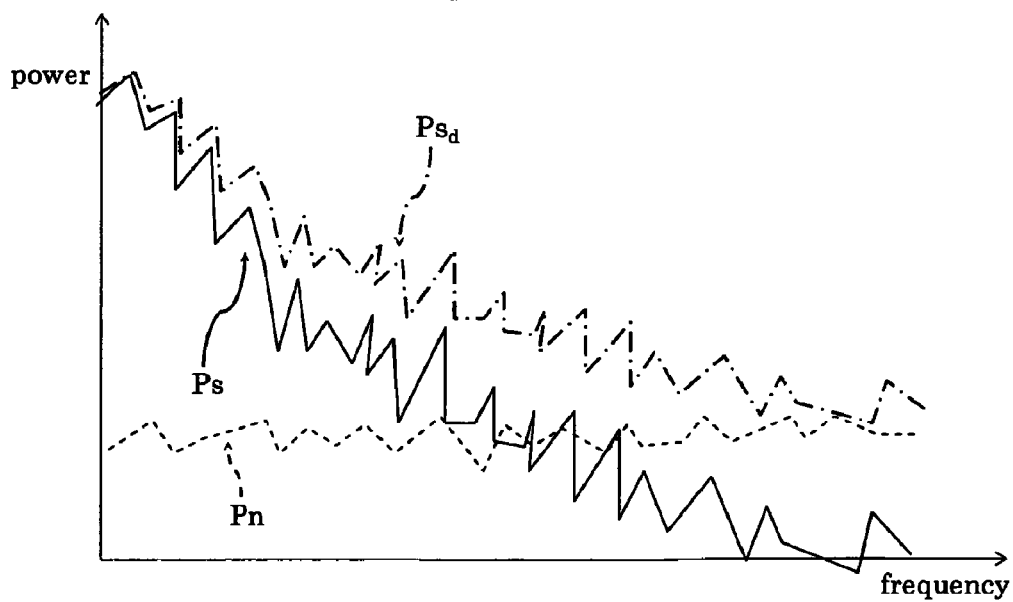
FIG. 38 is a graph showing a relationship between ideal signal power Ps and actually measured signal power ($Ps_d$) using a related art.

FIG. 9 is a graph showing a relationship between the ideal signal power (Ps) and actually measured a signal power ($Ps_d$) based on the mean_Ps system. Compared to the graph in FIG. 38, it is clear that $Ps_d$ in the graph in FIG. 9 is close to the Ps and thus the $Ps_d$ using the mean_Ps system is effective to improve the SNR.

FIGS. 10 to 15 show figures to explain an improvement factor of MRI images.

Figure 10:
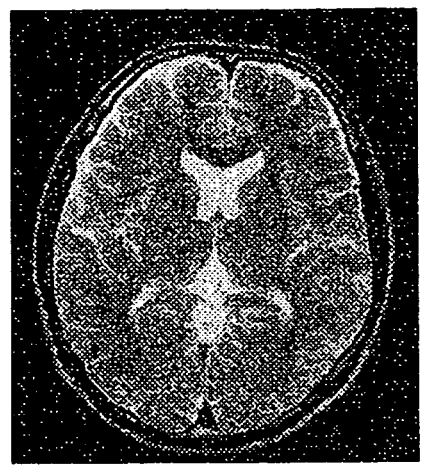
FIG. 10 explains an improvement factor of an MRI image.
Figure 11:
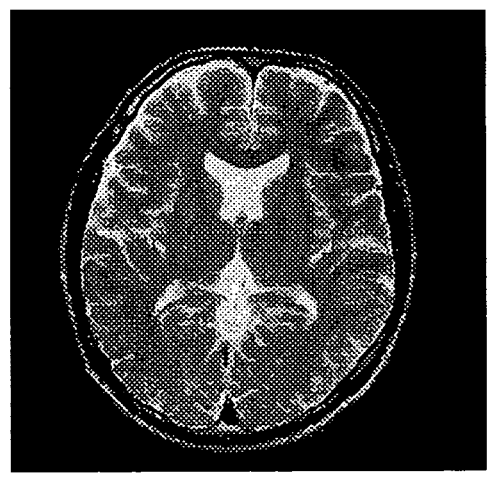
FIG. 11 explains an improvement factor of an MRI image.
Figure 12:
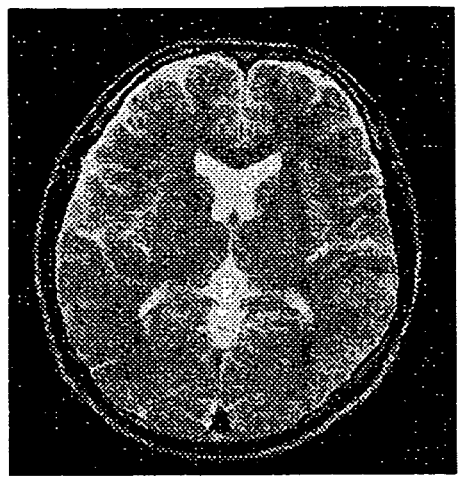
FIG. 12 explains an improvement factor of an MRI image.
Figure 13:
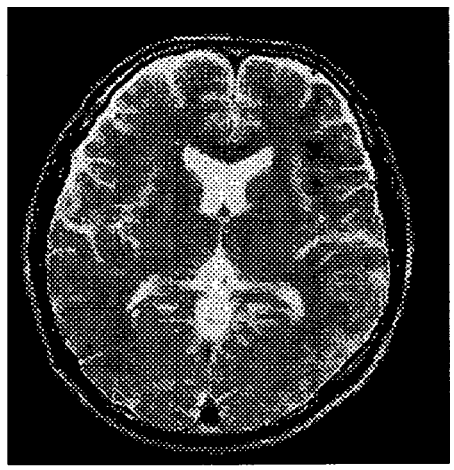
FIG. 13 explains an improvement factor of an MRI image.
Figure 14:
FIG. 14 explains an improvement factor of an MRI image.
Figure 15:
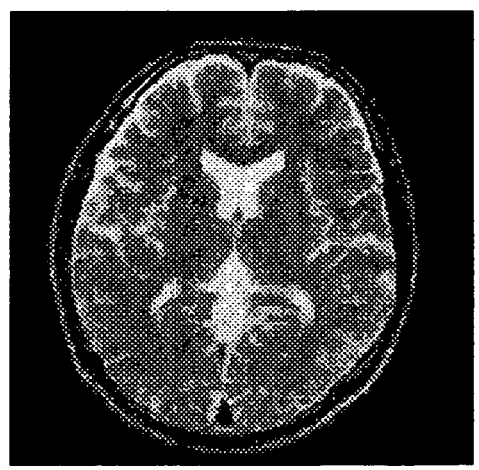
FIG. 15 explains an improvement factor of an MRI image.

FIG. 10 shows an MRI image ("RMSE=0.3785" and "SNR=1/64.9") provided by data containing the noise without recovery processing. FIG. 11 shows an ideal MRI image ("RMSE=0" and "SNR=1/11.8") that contains no noise. FIG. 12 shows an MRI image ("RMSE=0.2477" and "SNR=1/40.2") provided by data subjected to recovery processing using an FRWF based on the same_Ps system. FIG. 13 shows an MRI image ("RMSE=0.1345" and "SNR=1/6.7") provided by data subjected to recovery processing using an FRWF based on the ideal_Ps. FIG. 14 shows an MRI image ("RMSE=0.2642" and "SNR=1/45.1") provided by data subjected to recovery processing using an FTWF based on the same_Ps system. FIG. 15 shows an MRI image ("RMSE=0.1693" and "SNR=1/23.1") provided by data subjected to recovery processing using an FTWF based on the ideal_Ps.

Comparison between the MRI image shown in FIG. 13 and the MRI image shown in FIG. 15 shows that the MRI image (shown in FIG. 13) subjected to recovery processing using the FRWF is superior in image quality and is a superior improvement factor in the SNR. Comparison of the MRI image shown in FIG. 11 with the MRI images shown in FIGS. 10, 12, 13, and 14 shows that the MRI image (shown in FIG. 13) subjected to recovery processing using the FRWF based on the ideal_Ps is closest to the MRI image shown in FIG. 11.

The present exemplary embodiment relates to a method and application for specifically realizing the different_Ps system (e.g., the mean_Ps system) for estimating the Ps by using reference data containing data different from processing-target data. When the different_Ps system is used, it is ideal to use the same parameters for the data different from processing-target data. However, it is not necessarily realistic to additionally obtain data, different from processing-target data, for estimating the Ps. With respect to a variation permissible range of the Ps used for the WF, the aforementioned robustness for low frequency components can be used. Examples (1) to (7) in which the characteristic is taken advantage of will be described below.

(1) Dynamic Study

In dynamic study in which the same processing-target data are acquired in a time series, after a desired point of time at which, for example, a contrast agent is injected, data before the desired point of time is acquired as reference data with a high SNR. On the other hand, data after the desired point of time is acquired as processing-target data, with a reduced SNR to improve the temporal resolution. In this case, only the data before the desired point of time can be used as the reference data to estimate, as the Ps, the $Ps_d$ obtained by averaging adjacent data points. In this case, the difference between a time axis of the $Ps_d$ and the reference data can be a problem, and thus must be small enough to be negligible for application. In the contrast-imaging effect, a relatively large frequency change does not occur in high-frequency components, compared to low frequency components.

Even with the WF, the low frequency components are robust compared to the high-frequency components. Thus, the WF can be useful for data whose high-frequency components of signals do not change much. There is also a method using the property (i.e., a method in which only low-frequency components are acquired with respect to processing-target data after a desired point of time and are combined with high-frequency components of reference data before the desired point of time)

Figure 16:
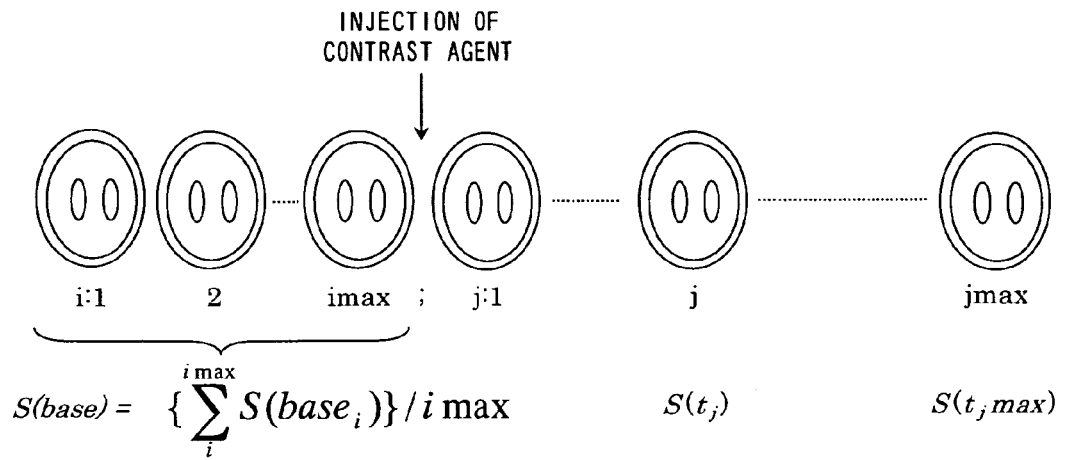
FIG. 16 is a schematic diagram showing an example of a case in which, in dynamic study, an SNR of only desired data is increased and only desired data is used as reference data.

(1-a) Case in Which the SNR of Only Reference Data is Increased and the Reference Data is Used FIG. 16 is a schematic diagram showing an example of a case in which, in dynamic study, the SNR of only desired data is increased and only the desired data is used as reference data. In this case, when the acquisition times of respective scans are the same, the $Ps_d$ (S(base)) is obtained from a following expression by averaging based on a group of reference data (S(base$_i$)) acquired before the injection of a contrast agent. Alternatively, NAQ is increased from the beginning for an MRI examination or an RI examination or the dose is increased for a CT examination to acquire the group of reference data.

$$S(\text{base}) = \frac{\sum_{i}^{i\max} S(\text{base}_i)}{i\max}$$

Figure 17:
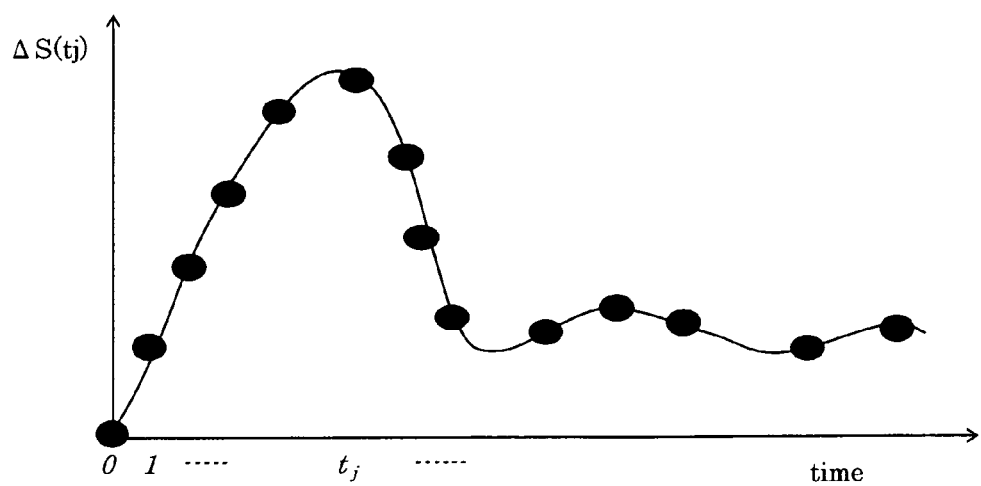
FIG. 17 is a graph showing a group of reference data obtained by averaging and a density change curve obtained using a contrast agent.

FIG. 17 is a graph showing the group of reference data obtained by averaging and a density change curve obtained using a contrast agent. In this case, "ΔS(t$_j$)=S(t$_j$)−S(base)" is satisfied.

(1-b) Case in Which All Data are Averaged and the Averaged Data is Used

The mean_Ps system is not limited to a case in which only data acquired before the injection of a contrast agent is used as reference data and Ps$_d$ of the reference data is estimated as the Ps. The mean_Ps system may be used in a case in which all time-series data that also include processing-target data acquired after the injection of the contrast agent are averaged, the averaged data is used as reference data, and the Ps$_d$ thereof is estimated as the Ps. Data obtained from an area where a movement or position shift occurs or data after correction are used, if needed.

In case (1-b), the SNR improving effect of the WF is larger in case (1-b) than case (1-a), since the SNR of the Ps$_d$ of the reference data improves. On the other hand, the possibility that differences in motion and contrast are affected is larger in case (1-b) than case (1-a).

(2) For functional-MRI (f-MRI)

In an f-MRI, multiple pieces of data are acquired over time while ON/OFF states of the load are repeated at regular intervals. Since this is basically the same as in the case of the dynamic study, the same method can essentially be used. The reference data may be acquired with an increased NAQ and the Ps$_d$ of the reference data may be used for the time-axis data after and before the load application. In a more practical sense, the f-MRI acquires two sets of data having different contrasts from each other after and before the load application, the Ps$_d$ may be divided into two types of the Ps$_d$, namely, Ps$_d$[1] of first reference data composed of only data before the load application and Ps$_d$[2] of second reference data composed of only data after the load application. Compared to a case in which the average of all data after and before the load application is used, the SNR of the Ps$_d$ decreases to 1/√2, but Ps$_d$ difference caused by a difference in contrast can be minimized.

(3) Data After Image Standardization

It is possible to use the same types of parameter data even for different examinations. When an image is modified as ideal data and is standardized, standardized data can be used for any patient's data. Further, since any past data of the same patient can be used, it is not necessary to further acquire ideal data.

(4) Images of Different Types of Parameter for the Same Patient

It is also possible to use image data of different types of parameter for the same patient, the data being acquired in the same examination session. A parameter with which the SNR is better is used for Ps. For the MRI examination, T1 weighting (T1W) can be used for T2 weighting (T2W) and T2W or the like can be used for a fluid attenuated inversion recovery (FLAIR).

(5) Before and After Contrast Imaging

For contrast imaging, an image-capture operation is generally performed once before the contrast imaging and once after the contrast imaging for the same examination session. In the mean_Ps system in this case, with respect to data before the contrast imaging, only data before the contrast imaging is used as reference data and the Ps$_d$ of the reference data is estimated as the Ps, and with respect to data after the contrast imaging, reference data is obtained by also adding data before the contrast imaging to data after the contrast imaging and the Ps$_d$ of the reference image is estimated as the Ps. Even when the two types of data have the same SNR, the data after the contrast imaging satisfies "Ps_SNRR=sqrt (2)=1.4", thereby improving the SNR.

(6) Signals that Change Over Time

For digitalized data (audio and moving images) that change over time, the Ps is estimated using the Ps$_d$ of reference data obtained by averaging data in a fixed time and is applied to processing-target data that are generated and that have a similar Ps distribution. Alternatively, a portion that does not change much over time is extracted and the Ps is applied to only the portion. In particular, for filtering in Fourier space, a translation in the Fourier space is a change in phase in the Fourier space, and thus, a change in Ps corresponding to the square of a signal value does not occur. Thus, the translation is robust relative to a certain level of motion. However, although the SNR improves by the use of a mere frame average, variations occur when there is motion.

(7) For Diffusion Tensor Imaging (DTI)

This example shows an application to DTI data and data in motion probing gradient (MPG) axes are averaged to reduce residual error of random noise.

Figure 18:
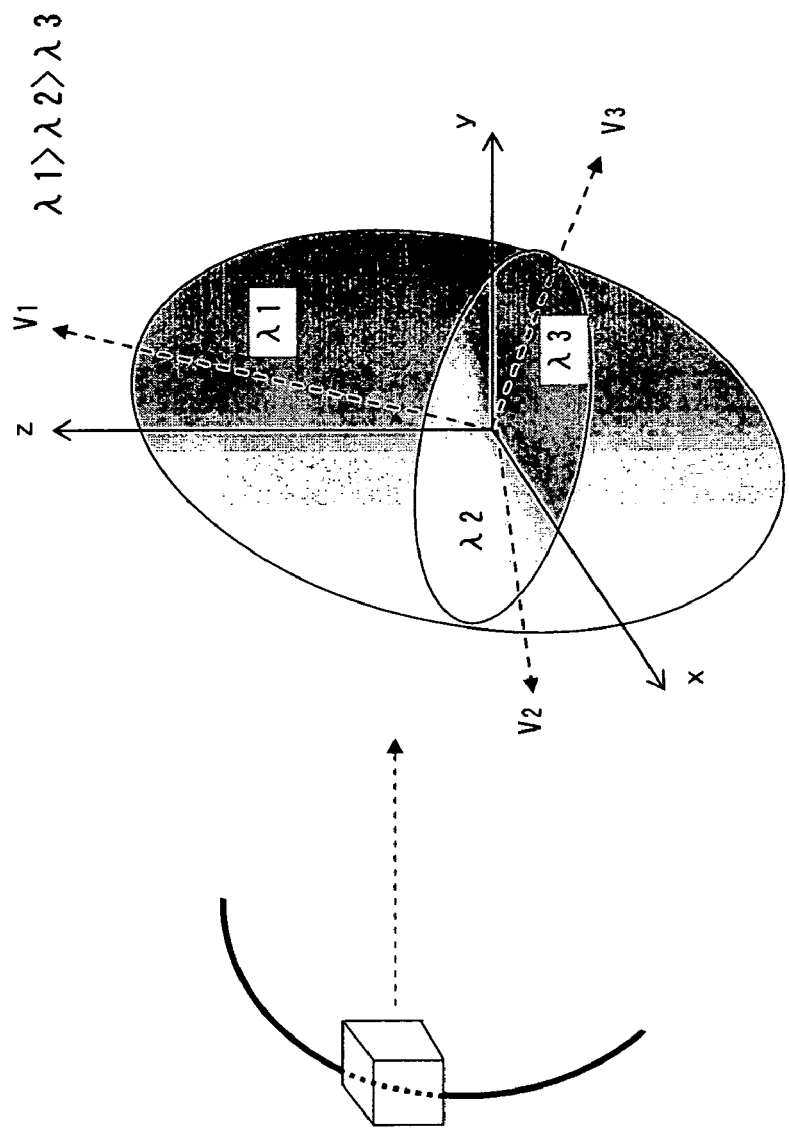
FIG. 18 is a diagram showing an anisotropic property of diffusion.

FIG. 18 is a diagram showing an anisotropic property of diffusion.

The orientations of nerve fibers match each other in a longitudinal-axis direction in which the diffusion is large. λ1, λ2, and λ3 indicate the sizes of diffusion coefficients in decreasing order of size and V1, V2, and V3 indicates directions. Six parameters are computed for each voxel, and a parameter "flip angle (FA)" indicating an anisotropic property, tractography that expresses nerves by tracking the vector V1 in the longitudinal axis, and so on are imaged.

FIGS. 19 to 25 are views showing diffusion weighted images (DWIs) obtained by an FRWF.

Figure 19:
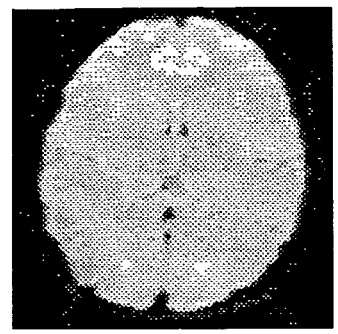
FIG. 19 is a view showing a diffusion weighted image (DWI) obtained by an FRWF.
Figure 20:
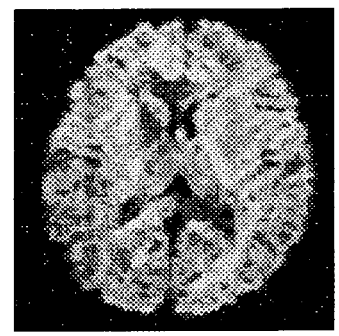
FIG. 20 is a view showing a DWI obtained by an FRWF.
Figure 21:
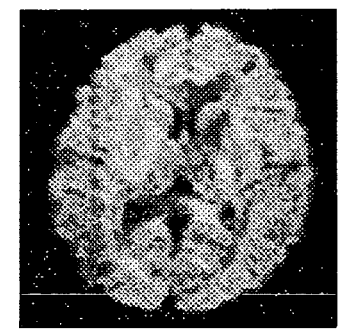
FIG. 21 is a view showing a DWI obtained by an FRWF.
Figure 22:
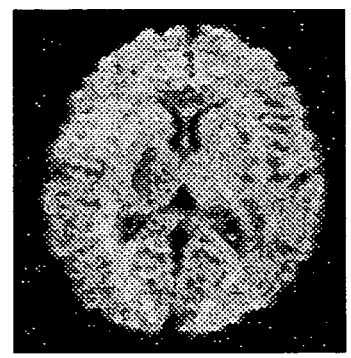
FIG. 22 is a view showing a DWI obtained by an FRWF.
Figure 23:
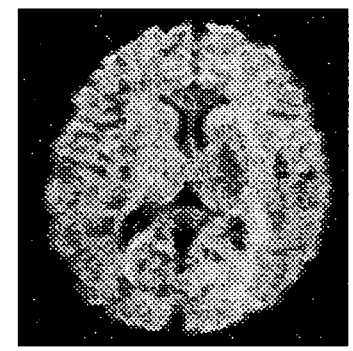
FIG. 23 is a view showing a DWI obtained by an FRWF.
Figure 24:
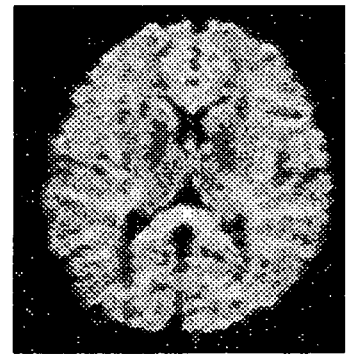
FIG. 24 is a view showing a DWI obtained by an FRWF.
Figure 25:
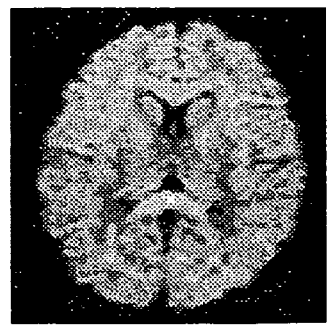
FIG. 25 is a view showing a DWI obtained by an FRWF.

When the MPG direction is expressed by b (x, y, z), FIG. 19 shows a DWI in b0 (0, 0, 0), FIG. 20 shows a DWI in b1 (1, 1, 0), FIG. 21 shows a DWI in b2 (1, −1, 0), FIG. 22 shows a DWI in b3 (0, 1, 1), FIG. 23 shows a DWI in b4 (0, 1, −1), FIG. 24 shows a DWI in b5 (1, 0, 1), and FIG. 24 shows a DWI in b6 (−1, 0, 1).

FIGS. 26 to 29 show DWIs due to differences in Ps of the FRWF.

Figure 26:
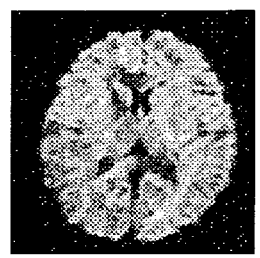
FIG. 26 is a DWI due to differences in Ps of an FRWF.
Figure 27:
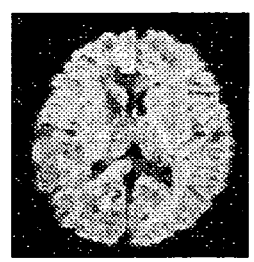
FIG. 27 is a DWI due to differences in Ps of an FRWF.
Figure 28:
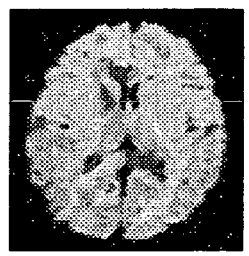
FIG. 28 is a DWI due to differences in Ps of an FRWF.
Figure 29:
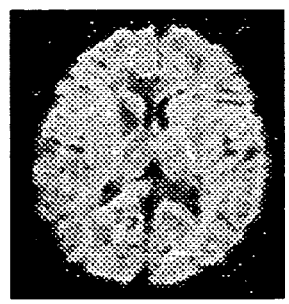
FIG. 29 is a DWI due to differences in Ps of an FRWF.

FIG. 26 shows an original DWI, which has not been subjected to noise recovery processing. FIG. 27 shows a DWI subjected to recovery processing using a FRWF based on the same_Ps. FIG. 28 shows a DWI subjected to recovery processing using a FRWF based on the mean_Ps. FIG. 29 shows a DWI subjected to recovery processing using a FRWF based on the ideal_Ps.

FIGS. 30 to 33 show FA maps due to a difference in Ps of the FRWF.

The images shown in FIGS. 30 to 33 are created from seven sets of images shown in FIGS. 19 to 25.

Figure 30:
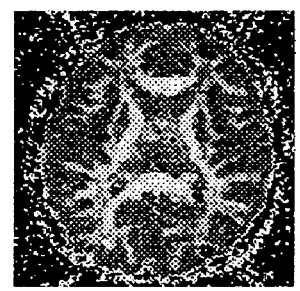
FIG. 30 is a flip angle (FA) map due to a difference in Ps of an FRWF.
Figure 31:
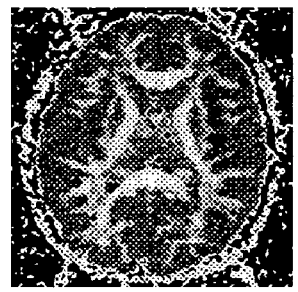
FIG. 31 is a FA-map due to a difference in Ps of a FRWF.
Figure 32:
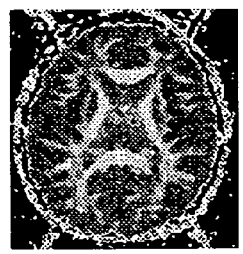
FIG. 32 is a FA-map due to a difference in Ps of a FRWF.
Figure 33:
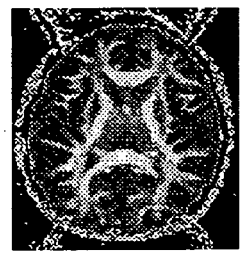
FIG. 33 is a FA-map due to a difference in Ps of a FRWF.

Specifically, the FA map shown in FIG. 30 has not been subjected to noise recovery processing, the FA map shown in FIG. 31 was subjected to recovery processing using a FRWF based on the same_Ps, the FA map shown in FIG. 32 was subjected to recovery processing using a FRWF based on mean_Ps, and the FA map shown in FIG. 33 was subjected to recovery processing using a FRWF based on the ideal_Ps.

Figure 34:
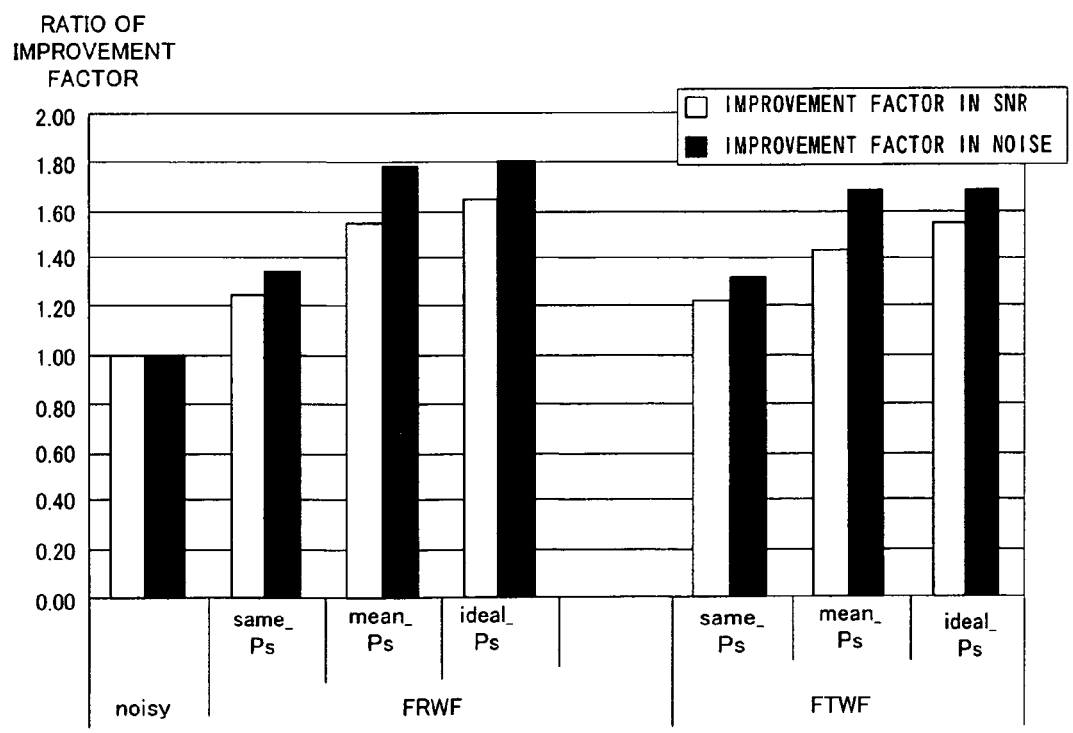
FIG. 34 is a graph showing an improvement factor in an SNR when the WFs are used.

FIG. 34 is a graph showing an improvement factor in the SNR when the WFs are used.

It can been seen that, compared to the same_Ps system, the mean_Ps system improves the RMSE, which is a numerical index indicating a difference between a visual image and an ideal image, to a level comparable to the case in which the ideal_Ps is used. The mean_Ps system is very effective method to readily improve the SNR of DTIs.

Compared to a typical method using the $Ps_d$ of processing-target data as Ps, examples (1) to (7) described above can further improve the SNR of processing-target data while minimizing deterioration of the spatial resolution.

Examples (1) to (7) can not only be applied to typical Fourier space but also be applied to any space in which the frequency band is split, such as FREBAS space.

In addition, even compared to the same_Ps system in which processing-target data are smoothed to reduce the noise components of Ps, the mean_Ps system can reduce RMSE, which is an index indicating an error relative to ideal data. Further, optimum conditions of the parameters do not depend on data. Thus, in the mean_Ps system, when the Ps_SNRR of reference data used as the Ps of the WF satisfies a predetermined criterion, the RMSE is saturated and thus the robustness for condition setting is large. Thus, it is possible to use a WF equation based on the theory that the Ps does not contain noise when a predetermined criterion of the Ps_SNRR is satisfied. Thus, since a scheme in which the Ps_SNRR of the reference data is measured and is compared with a predetermined criterion for the Ps_SNRR to thereby select an optimum filter form is provided, automation is possible.

Typically, in the different_Ps system, data different from processing-target data is required. For application to cases in which multiple pieces of data are acquired for the same target, for example, for cases in which data of different parameters in T1 weighting (T1W), T2W, proton W, and so on in dynamic study, load testing (such as f-MRI), and MRI are acquired, it is sufficient to determine the data different from processing-target data by averaging already available data, which does not require additional acquisition of reference data for estimating the Ps.

Basic data used for the Ps estimation in the present exemplary embodiment may be generated by a diagnostic imaging apparatus that is different from the diagnostic imaging apparatus in which processing-target data is generated. For example, when the magnetic resonance imaging apparatus 10 is used to generate processing-target data regarding a desired portion, the diagnostic imaging apparatus, such as an X-ray CT apparatus, a SPECT apparatus, a PET apparatus, a PET-CT apparatus, and an ultrasonic diagnostic apparatus, is used with respect to a portion equivalent to the desired portion to generate reference data.

In the present embodiment, the mean_Ps system has been described as one example of the different_Ps system for estimating the $Ps_d$ as the Ps by using reference data containing data different from processing-target data. However, the different_Ps system in the present invention may be a weighted_mean_Ps system in which the $Ps_d$ obtained by weighted-averaging of adjacent data points is estimated as the Ps based on reference data similar to processing-target data. In the weighted_mean_Ps, weighing of processing-target data is increased for low-frequency components. On the other hand, for high-frequency components, weighting of either one of processing-target data and data different from the processing-target data, the either one having a larger SNR of the $Ps_d$, is increased.

With $Ps_d$ based on the mean_Ps system, an improvement effect in the SNR is large-for high-frequency components, but is small for low-frequency components. Low-frequency components define rough contrast, and thus, in low-frequency components, when there is a difference between $Ps_d$ ($Ps_d$ [mean_Ps]) determined by the mean_Ps system and $Ps_d$ ($Ps_d$ [same_Ps]) determined by the same_Ps system, the low-frequency characteristics of the WF deteriorate. Thus, when the mean_Ps system is used as the different_Ps system, $Ps_d$ [mean_Ps] may results in a case in which the WF cannot be optimally estimated compared to the ideal_Ps.

Accordingly, in order to prevent the deterioration of low-frequency characteristics even when the difference between the $Ps_d$ [mean_Ps] and the $Ps_d$ [same_Ps] is relatively large, Ps is estimated using the weighted_mean_Ps system. $Ps_d$ ($Ps_d$ [weighted_mean_Ps]) in the weighted_mean_Ps system can be represented as a following expression (13), when "W" indicates a weight. The terms in expression (13) are functions of frequencies. The weight W is determined so that the weighting of the same_Ps becomes large in a low frequency.

$$Ps_d[\text{weighted\_mean\_Ps}] = W \times Ps_d[\text{same\_Ps}] + (1-W) \times Ps_d[\text{mean\_Ps}] \quad (13)$$

Figure 35:
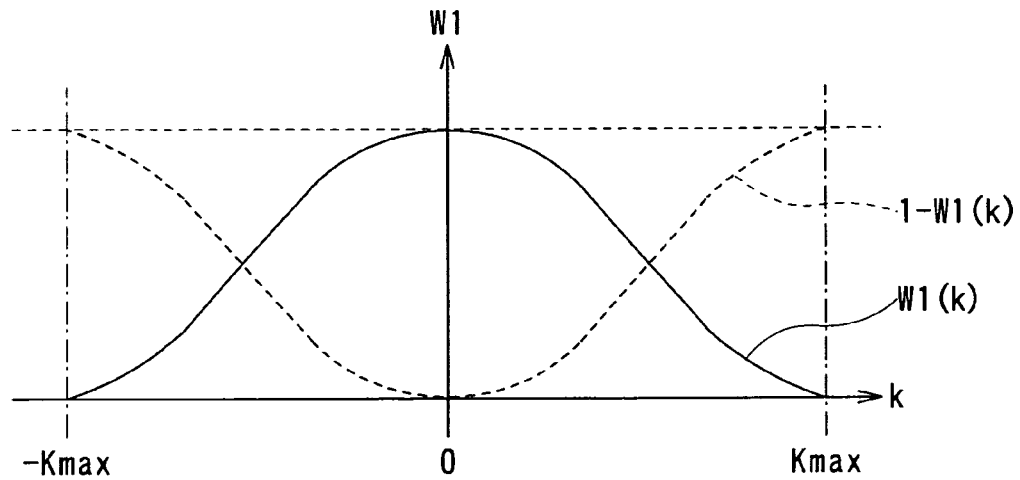
FIG. 35 is a graph showing one example of a weighting function in a weighted_mean_Ps system.

FIG. 35 is a graph showing one example of a weighting function in the weighted mean_Ps_system.

As shown in FIG. 35, the weight W in Expression (13) is a function of a frequency k for the FTWF. Using a 1D Hanning function, the weight W is given as a following expression (14).

$$W1(k) = 0.5 \times \left(1 - \cos\left[\frac{-\pi \times k}{K_{\max}}\right]\right) \quad (14)$$

As a first modification of the weighted_mean_Ps system, there is a method in which the weight W in Expression (13) is determined based on the difference between an image and the Ps to optimally control the weighting. For example, the weighting is dynamically controlled based on the degree of a difference E ($Ps_d$ difference) between the $Ps_d$ [mean_Ps] and the $Ps_d$ [same_Ps], represented as a following expression.

$$E = |Ps_d[\text{mean\_Ps}] - Ps_d[\text{same\_Ps}]|$$

A difference in high frequency components which is caused by a difference in the noise can occur between the $Ps_d$ [mean_Ps] and the $Ps_d$ [same_Ps]. Thus, since it is desired to increase the difference in low-frequency components, the $Ps_d$ difference E is determined after performing smoothing or is determined using an average in a certain low-frequency range.

Further, the $Ps_d$ difference E may be a function in filter space k and may be a value obtained by averaging with respect to k. In short, for a larger $Ps_d$ difference E, the weighting of the $Ps_d$ [same_Ps] is increased.

Figure 36:
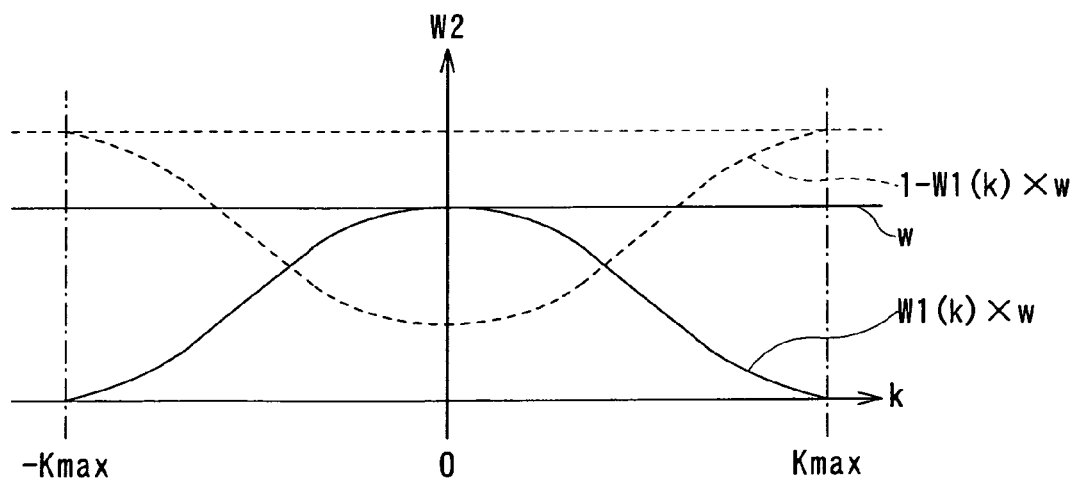
FIG. 36 is a graph showing a second modification of the weighting function in a weighted_mean_Ps system.
Figure 37:
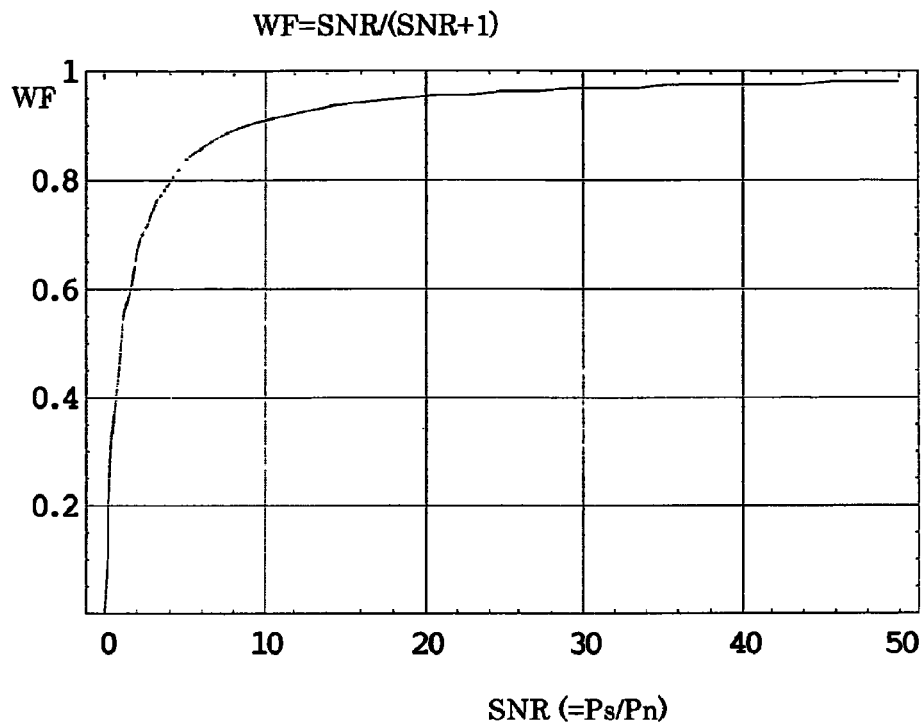
FIG. 37 is a gain characteristic relative to an SNR in an ideal WF.

FIG. 36 is a graph showing a second modification of the weighting function in the weighted_mean_Ps system.

Using a threshold Eth of the $Ps_d$ difference E, w is determined so as to satisfy the following expression (15). Additionally, as shown in FIG. 36, expressions (14) and (15) are combined, and the weighing W in expression (13) is expressed by a function (W2(k)) of a frequency k as a following expression (16).

$$w = 1 - \frac{|E - Eth|}{Eth}, (E < Eth) \quad (15)$$

$$W2(k) = W1(k) \times w \quad (16)$$

In Expression (16), For E=0, W is equal to 0. In this case, based on Expression (13), the $Ps_d$ [weighted_mean_Ps] is generated using only the $Ps_d$ [mean_Ps]. Similarly, in Expression (16), For "E=Eth", W is equal to "1". In this case, based on Expression (13), the $Ps_d$ [weighted_mean_Ps] is generated using only the $Ps_d$ [same_Ps].

The method for estimating the Ps by using the weighted_mean_Ps is particularly effective for data having larger difference between the image and the Ps. For example, the method is effective for cases in which the contrast is inverted, such as cases of T1, T2, and proton in MRI. Although the description in the present exemplary embodiment has been given of a case in which image data obtained by the diagnostic imaging apparatus is subjected to recovery processing performed by the WF, the present exemplary embodiment is not limited to medical images. For example, the present exemplary embodiment is applicable to any image data that contains noise of commercially available digital TVs, digital cameras, and so on. In addition, the present exemplary embodiment is applicable to digital multimedia in various fields for processing not only image data but also audio signals and so on.

According to the data processing system, the data processing method, the diagnostic imaging apparatus, and the magnetic resonance imaging apparatus of the present exemplary embodiment, in an application to processing-target data having actual noise, the SNR is improved while spatial frequency components of the processing-target data are reserved as much as possible, and an adequate WF having a large improvement effect of characteristic deterioration allows data processing to be appropriately performed.

What is claimed is:

1. A data processing method comprising use of a programmed computer system having a CPU and memory to process acquired signal data representing physical structures or events by:
   (A) estimating signal power by using reference data containing data similar to processing-target data; and
   (B) processing the processing-target data by using a wiener function (WF) based on the signal power estimated in the step of (A),
   wherein when multiple pieces of reference data are acquired, the signal power is determined by weighted averaging of the multiple pieces of reference data, and
   wherein the signal power is determined by increasing the weighting of the processing-target data with respect to a low-frequency component and by increasing the weighting of either one of the processing-target data and data different from the processing-target data, the either one having a larger SNR of the signal power.

2. A data processing method comprising use of a programmed computer system having a CPU and memory to process acquired signal data representing physical structures or events by:
   (A) estimating signal power by using reference data containing data similar to processing-target data; and
   (B) processing the processing-target data by using a wiener function (WF) based on the signal power estimated in the step of (A),
   wherein the WF is computed from either:

$$WF = \frac{\max[0, (Ps - aPn)]}{Ps};$$

$$WF = \max\left[0, \left\{1 - a\left(\frac{1}{SNR}\right)\right\}\right]; \text{ or}$$

an equivalent expression, wherein "Ps" represents signal power, "Pn" represents noise power, and "a" represents a parameter for controlling an estimated ratio between "SNR" and noise power Pn.

3. The data processing method comprising use of a programmed computer system having a CPU and memory to process acquired signal data representing physical structures or events by:
   (A) estimating signal power by using reference data containing data similar to processing-target data; and
   (B) processing the processing-target data by using a wiener function (WF) based on the signal power estimated in the step of (A),
   wherein the WF is computed from:

$$WF = \frac{H^* Ps}{|H|^2 Ps + Pn}; \text{ or}$$

an equivalent expression, wherein "Ps" represents signal power, "Pn" represents noise power, "H" represents a deterioration characteristic, and "*" represents a complex conjugate.

4. The data processing method comprising use of a programmed computer system having a CPU and memory to process acquired signal data representing physical structures or events by:
   (A) estimating signal power by using reference data containing data similar to processing-target data; and
   (B) processing the processing-target data by using a wiener function (WF) based on the signal power estimated in the step of (A),
   wherein image data before injection of a contrast agent is acquired, image data after the injection of the contrast agent is compared with the image data before the injection of the contrast agent and is acquired as the processing-target data with a reduced an SNR, and the image data before the injection of the contrast agent is used as the reference data.

5. The data processing method comprising use of a programmed computer system having a CPU and memory to process acquired signal data representing physical structures or events by:
   (A) estimating signal power by using reference data containing data similar to processing-target data; and
   (B) processing the processing-target data by using a wiener function (WF) based on the signal power estimated in the step of (A),
   wherein image data before injection of a contrast agent is acquired, image data after the injection of the contrast agent is compared with the image data before the injection of the contrast agent and is acquired as the processing-target data with a reduced SNR, all time-series data including the data before the injection of the contrast agent and the data after the injection of the contrast agent are averaged, and the averaged data is used as the reference data.

* * * * *